US012771293B2

(12) United States Patent
Motz et al.

(10) Patent No.: US 12,771,293 B2
(45) Date of Patent: Oct. 20, 2026

(54) OSCILLATOR CIRCUITS, CURRENT SOURCES AND METHODS FOR PROVIDING PERIODIC FREQUENCY SIGNALS

(71) Applicant: Infineon Technologies AG, Neubiberg (DE)

(72) Inventors: Edwin Mario Motz, Wernberg (AT); Alessandro Michelutti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/986,264

(22) Filed: Dec. 18, 2024

(65) Prior Publication Data

US 2026/0039247 A1 Feb. 5, 2026

(30) Foreign Application Priority Data

Dec. 23, 2023 (DE) ......................... 102023213324.5

(51) Int. Cl.

| | |
|---|---|
| ***H03B 5/04*** | (2006.01) |
| ***H03B 5/24*** | (2006.01) |
| ***H03K 3/011*** | (2006.01) |
| *H03K 3/03* | (2006.01) |

(52) U.S. Cl.

CPC ................. *H03B 5/04* (2013.01); *H03B 5/24* (2013.01); *H03K 3/011* (2013.01); *H03K 3/0315* (2013.01)

(58) Field of Classification Search

CPC ........................................................ H03B 5/04

USPC .......................................................... 331/176

See application file for complete search history.

(56) References Cited

U.S. PATENT DOCUMENTS

| | | | | |
|---|---|---|---|---|
| 6,356,161 B1 * | 3/2002 | Nolan | H03K 3/011 331/74 |
| 11,115,036 B1 | 9/2021 | Zhao et al. | |
| 11,831,314 B1 * | 11/2023 | del Cesta | H03K 3/0315 |
| 2014/0028409 A1 | 1/2014 | Mahooti et al. | |
| 2015/0091537 A1 * | 4/2015 | Caffee | G05F 1/575 323/265 |
| 2017/0104475 A1 | 4/2017 | Lam | |
| 2022/0021361 A1 | 1/2022 | Vander Voorde et al. | |
| 2022/0244322 A1 * | 8/2022 | Motz | G01R 33/07 |
| 2024/0113717 A1 * | 4/2024 | Bahr | H03K 3/0315 |

* cited by examiner

*Primary Examiner* — Joseph Chang

(74) *Attorney, Agent, or Firm* — Harrity & Harrity, LLP

(57) ABSTRACT

An oscillator circuit includes a temperature and mechanical stress compensated current source configured to provide a first electrical current. The oscillator circuit further includes a switched capacitor configured to provide a second electrical current. The oscillator circuit further includes an integrator configured to perform an integration based on a difference of the first electrical current and the second electrical current and to provide an integration signal based on the integration. The oscillator circuit further includes an oscillator configured to provide an output frequency signal, wherein the output frequency signal is controlled based on the integration signal provided by the integrator. The second electrical current provided by the switched capacitor is controlled in a feedback loop based on the output frequency signal of the oscillator.

20 Claims, 3 Drawing Sheets

OSCILLATOR CIRCUITS, CURRENT SOURCES AND METHODS FOR PROVIDING PERIODIC FREQUENCY SIGNALS

CROSS-REFERENCE TO RELATED APPLICATION

This application claims priority to Germany Patent Application No. 102023213324.5 filed on Dec. 23, 2023, the content of which is incorporated by reference herein in its entirety.

TECHNICAL FIELD

The present disclosure relates to oscillator circuits, current sources and methods for providing periodic frequency signals.

BACKGROUND

Oscillator circuits may suffer from mechanical stress that may occur in various scenarios, such as when packaging the oscillator, when soldering the packaged oscillator to a printed circuit board or if moisture occurs in the oscillator package. As a result of the occurring mechanical stress, the oscillator frequency may change by up to two percent during the lifetime of the oscillator.

Manufacturers and developers of oscillator circuits are constantly striving to improve their products. In general, it may be desirable to provide highly stable and precise oscillators, preferably over their entire lifetime. More particular, it may be desirable to develop oscillator circuits with mechanical stress compensation to reduce lifetime drift effects.

SUMMARY

An aspect of the present disclosure relates to an oscillator circuit. The oscillator circuit includes a temperature and mechanical stress compensated current source configured to provide a first electrical current. The oscillator circuit further includes a switched capacitor configured to provide a second electrical current. The oscillator circuit further includes an integrator configured to perform an integration based on a difference of the first electrical current and the second electrical current and to provide an integration signal based on the integration. The oscillator circuit further includes an oscillator configured to provide an output frequency signal, wherein the output frequency signal is controlled based on the integration signal provided by the integrator. The second electrical current provided by the switched capacitor is controlled in a feedback loop based on the output frequency signal of the oscillator.

A further aspect of the present disclosure relates to an oscillator circuit. The oscillator circuit includes a PTAT voltage source configured to provide a voltage proportional to absolute temperature (VPTAT). The oscillator circuit further includes a reference voltage source configured to provide a reference voltage. The oscillator circuit further includes a resistor-capacitor element (e.g., an RC element) including a switched capacitor and a silicided and/or metal resistor. The oscillator circuit further includes an integrator, wherein a first input of the integrator is configured to receive a first input signal based on the reference voltage and an output voltage of the RC element, and a second input of the integrator is configured to receive a second input signal based on the VPTAT. The integrator is configured to perform an integration based on a difference or sum of the first input signal and the second input signal and to provide an integration signal based on the integration. The oscillator circuit further includes an oscillator configured to provide an output frequency signal, wherein the output frequency signal is controlled based on the integration signal provided by the integrator. The switched capacitor is controlled in a feedback loop based on the output frequency signal of the oscillator.

A further aspect of the present disclosure relates to a current source configured to provide a temperature and mechanical stress compensated electrical current. The current source includes a PTAT voltage source configured to provide a voltage proportional to absolute temperature (VPTAT), wherein the PTAT voltage source includes a silicided polysilicon resistor and/or metal resistor.

A further aspect of the present disclosure relates to a method for providing a periodic frequency signal. The method includes an act of providing a first electrical current using a temperature and mechanical stress compensated current source. The method further includes an act of providing a second electrical current using a switched capacitor. The method further includes an act of performing an integration based on a difference of the first electrical current and the second electrical current using an integrator, thereby providing an integration signal based on the integration. The method further includes an act of controlling an output frequency signal provided by an oscillator based on the integration signal. The method further includes an act of controlling the second electrical current provided by the switched capacitor based on the output frequency signal provided by the oscillator.

BRIEF DESCRIPTION OF THE DRAWINGS

Devices and methods in accordance with the disclosure are described in more detail below based on the drawings. Similar reference numerals may designate corresponding similar parts. The technical features of the various illustrated examples may be combined, provided they are not mutually exclusive, and/or may be selectively omitted if not described as being necessarily required.

DETAILED DESCRIPTION

Current sources in accordance with the disclosure may be configured to provide a temperature and mechanical stress compensated electrical current. The current sources may include a PTAT voltage source configured to provide a voltage proportional to absolute temperature (VPTAT), wherein the PTAT voltage source may include a silicided resistor and/or metal resistor. In particular, the silicided resistor may be a silicided polysilicon resistor.

Figure 1:
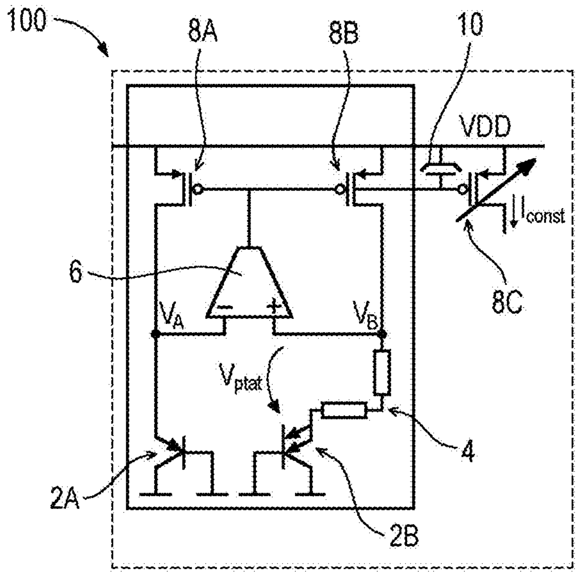
FIG. 1 illustrates a schematic diagram of a current source 100 in accordance with the disclosure.

Referring now to FIG. 1, an example current source 100 may include two transistors 2A, 2B, a resistor 4, an amplifier 6, three transistors 8A to 8C and a capacitor 10. In the illustrated example, the two transistors 2A and 2B may be bipolar transistors of different size, and the amplifier 6 may correspond to an operational transconductance amplifier (OTA). The resistor 4 may include or may correspond to at least one of a silicided resistor or metal resistor. In particular, the silicided resistor may be a silicided polysilicon resistor (or silicided polyresistor). In the illustrated example, the silicided resistor and/or metal resistor 4 may form an L-shaped resistor. The components of the current source 100 may be supplied by a supply voltage VDD.

The current source 100 may include a bandgap reference circuit with a first current path on the left including the first bipolar transistor 2A and a second current path on the right including the second bipolar transistor 2B. The silicided resistor and/or metal resistor 4 may be connected in series with the second bipolar transistor 2B. During operation, the transistors 8A, 8B and the OTA 6 may ensure that an electrical potential VA equals an electrical potential VB and that electrical currents through the first and second current path are equal. In the bandgap reference circuit, a voltage proportional to absolute temperature $V_{ptat}$ may be generated. Correspondingly, the current source 100 may be configured to generate a current proportional to absolute temperature (IPTAT). That is, the current source 100 may correspond to a PTAT current source including the described bandgap reference circuit. The electrical current $I_{ptat}$ may depend on the generated voltage $V_{ptat}$ and the resistance value $R_{silicided}$ of the silicided resistor and/or metal resistor 4, e.g., $I_{ptat} \sim V_{ptat}/R_{silicided}$.

A value of the electrical current $I_{ptat}$ may depend on a first temperature coefficient resulting from the voltage $V_{ptat}$. In particular, the voltage $V_{ptat}$ may increase proportional to temperature. In addition, a value $R_{silicided}$ of the silicided resistor and/or metal resistor 4 may depend on a second temperature coefficient. In a non-limiting example, each of the first and second temperature coefficients may be in a range from about 3100 ppm/K to about 3350 ppm/K. The first temperature coefficient resulting from the voltage $V_{ptat}$ may substantially match the second temperature coefficient of the silicided resistor and/or metal resistor 4. More particular, the values of the two temperature coefficients may match up to about 90 percent, or up to about 95 percent, or up to about 98 percent. As a result, a temperature dependency of the electrical current $I_{ptat}$ may cancel out such that the electrical current provided by the current source 100 may be temperature compensated.

The silicided resistor and/or metal resistor 4 may be substantially insensitive to mechanical stress. In general, metal resistors may be substantially independent of mechanical stress compared to polysilicon resistors or diffused resistors. Silicided resistors may have metallic properties on their surfaces and may thus react to mechanical stress in a similar way. In particular, a silicided resistor of the current source 100 may be a silicided polysilicon resistor which, unlike silicided diffusion resistors, does not necessarily suffer from leakage effects at high temperatures. In the illustrated example, the L-shaped silicided resistor and/or metal resistor 4 may include a first and second resistor serially connected and arranged substantially perpendicular to each other. Each of the two resistors may be a silicided resistor or a metal resistor. The perpendicular arrangement of the two resistors may account for mechanical stress in both directions such that usage of the L-shaped resistor 4 may be independent of direction. Due to the described mechanical stress independence of the silicided resistor and/or metal resistor 4, the electrical current provided by the current source 100 may be stress compensated.

Due to the described use of the silicided resistor and/or metal resistor 4, the current source 100 may represent a temperature and mechanical stress compensated current source configured to provide a (substantially) constant electrical current $I_{const}$. The constant electrical current $I_{const}$ may be referred to as a first electrical current of an oscillator circuit. In contrast to this, conventional current sources using polysilicon resistors and/or diffused resistors may suffer from temperature changes and mechanical stress exerted to the current source. For example, mechanical stress may occur when packaging the oscillator circuit, when soldering the packaged oscillator circuit to a printed circuit board, if moisture occurs in the oscillator package, or the like.

Figure 2:
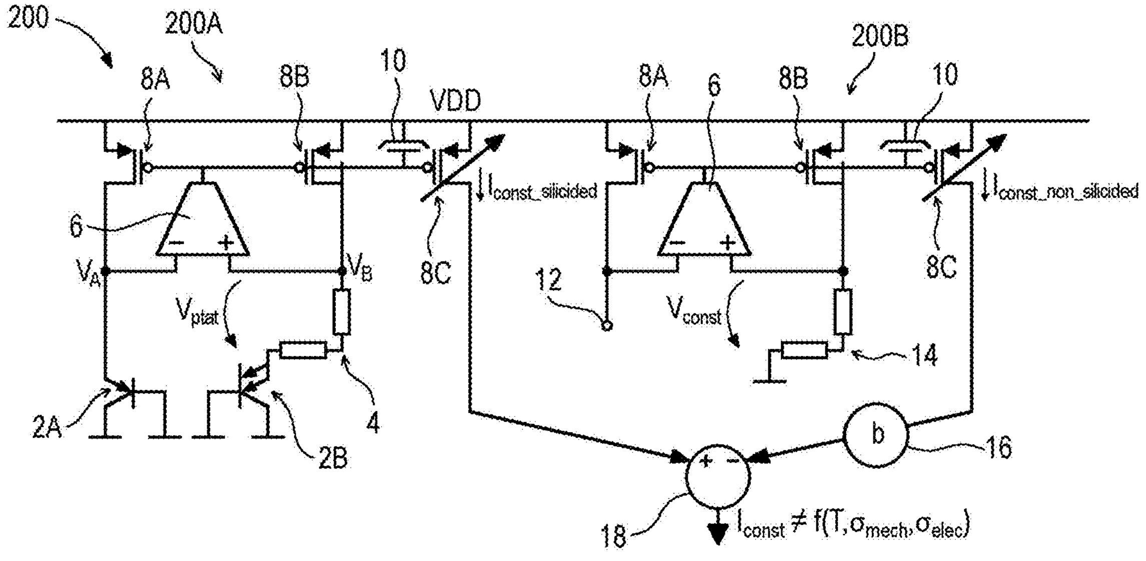
FIG. 2 illustrates a schematic diagram of a current source 200 in accordance with the disclosure.

Referring now to FIG. 2, a current source 200 is illustrated that may include some or all features of the current source 100 of FIG. 1. The current source 200 may be seen as an extension of the current source 100. The current source 200 may include a temperature and mechanical stress compensated current source 200A configured to provide a first electrical current $I_{const\_silicided}$. For example, the current source 200A may be similar to the current source 100 of FIG. 1. The first electrical current $I_{const\_silicided}$ may thus be substantially independent of temperature changes and mechanical stress as previously described in connection with FIG. 1. The first electrical current $I_{const\_silicided}$ may depend on the voltage $V_{ptat}$ and the resistance value $R_{silicided}$ of the silicided resistor and/or metal resistor 4, e.g., $I_{ptat} \sim V_{ptat}/R_{silicided}$. The first electrical current $I_{const\_silicided}$ may be referred to as a third electrical current of an oscillator circuit.

The current source 200 may further include a constant voltage source 200B configured to generate a substantially constant voltage $V_{const}$. The voltage source 200B may include similar components to the current source 200A. A voltage source 12 configured to provide a constant voltage may be arranged in a left current path, while a resistor 14 may be arranged in a right current path. For example, the constant voltage source 12 may be substantially independent of temperature changes, e.g., an associated temperature coefficient may have a value of about 0 ppm/K.

The resistor 14 may include or may correspond to a non-silicided polysilicon resistor. In a non-limiting example, the non-silicided polysilicon resistor 14 may depend on a temperature coefficient in a range from about 0 ppm/K to about 200 ppm/K. A generated second electrical current $I_{const\_non\_silicided}$ may be mirrored and output by the third transistor 8C. The second electrical current $I_{const\_non\_silicided}$ may depend on the constant voltage $V_{const}$ and a resistance value $R_{poly\_non\_silicided}$ of the non-silicided polysilicon resistor 14, e.g., $I_{const\_non\_silicided} \sim V_{const}/R_{poly\_non\_silicided}$. The second electrical current $I_{const\_non\_silicided}$ may be referred to as a fourth electrical current of an oscillator circuit.

An electrical current $I_{const}$ output by the current source 200 may be generated based on the first electrical current $I_{const\_silicided}$ and the second electrical current $I_{const\_non\_silicided}$. In this context, the current source 200 may include a weighting unit 16 configured to receive and weight the second electrical current $I_{const\_non\_silicided}$ with a weighting factor b. In addition, the current source 200 may include an adder and/or subtractor 18 configured to output a sum or a difference of two input signals. In the illustrated example, the electrical current $I_{const}$ output by the current source 200 may depend on a summation of the first electrical current $I_{const\_silicided}$ and the second electrical current $I_{const\_non\_silicided}$ weighted by the weighting factor b. Alternatively, the electrical current $I_{const}$ provided by the current source 200 may depend on a subtraction of the second electrical current $I_{const\_non\_silicided}$ weighted by the weighting factor b from the first electrical current $I_{const\_silicided}$.

The weighting factor b may be adjusted to reduce a mechanical stress dependence of the provided electrical current $I_{const}$. The silicided resistor/metal resistor 4 may depend on a first piezo-resistive coefficient S1, while the non-silicided polysilicon resistor 14 may depend on a second piezo-resistive coefficient S2. A mechanical stress dependence may be reduced if a piezo-resistive coefficient $$S = \frac{S1 + b \cdot S2}{1 + b}$$

is adjusted to have a value of essentially zero. In a non-limiting example, the piezo-resistive coefficients S1 and S2 may have values of about 1.5%/GPa and about 4.9%/GPa, respectively. In such case, the weighting factor b may be adjusted to have a value of about 0.31 (or about −0.31) such that the value of S may essentially equal zero. Compared to the example of FIG. 1, the current source 200 may use the additional resistor 14 in order to achieve an additional compensation of mechanical stress dependence. The current source 200 may thus be seen as an extension of the current source 100 of FIG. 1.

Figure 3:
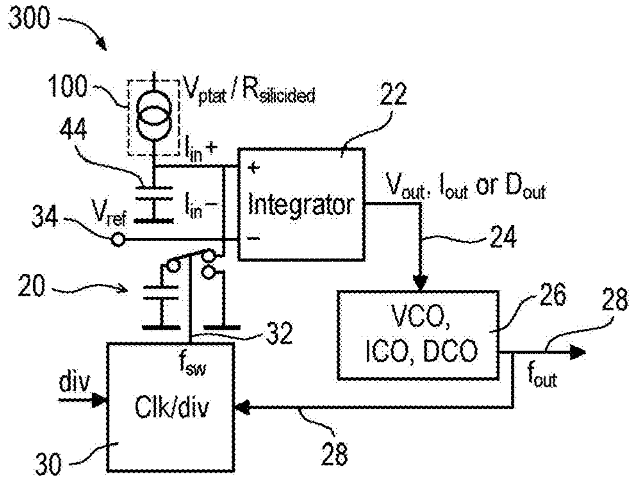
FIG. 3 illustrates a schematic diagram of an oscillator circuit 300 in accordance with the disclosure.

Referring now to FIG. 3, a schematic diagram of an oscillator circuit 300 in accordance with the disclosure is illustrated. Oscillator circuits as described herein may particularly correspond to on-chip oscillators. The oscillator circuit 300 may include a temperature and mechanical stress compensated current source 100 (see $V_{ptat}/R_{silicided}$) configured to provide a first electrical current $I_{in}+$. The first electrical current $I_{in}+$ may be referred to as a first electrical current of an oscillator circuit.

For example, the current source 100 of FIG. 3 may be similar to one of the current sources 100 and 200 of FIGS. 1 and 2. The oscillator circuit 300 may further include a switched capacitor 20 configured to provide a second electrical current $I_{in}-$. The second electrical current $I_{in}-$ may be referred to as a second electrical current of an oscillator circuit.

An integrator 22 of the oscillator circuit 300 may be configured to perform an integration based on a difference of the first electrical current $I_{in}+$ and the second electrical current $I_{in}-$ and to provide an integration signal 24 based on the integration. The oscillator circuit 300 may further include an oscillator 26 configured to provide an output frequency signal 28 of an output frequency $f_{out}$. The output frequency signal 28 may be controlled based on the integration signal 24 provided by the integrator 22. The second electrical current $I_{in}-$ provided by the switched capacitor 20 may be controlled in a feedback loop based on the output frequency signal 28 of the oscillator 26.

In the illustrated example, the oscillator circuit 300 may include a frequency divider 30 configured to provide a switching frequency signal 32 of a switching frequency $f_{sw}$ based on the output frequency signal 28 provided by the oscillator 26. In particular, the frequency divider 30 may be configured to divide an input signal Clk by a division factor div. The switching frequency signal 32 may be configured to control the second electrical current $I_{in}-$ provided by the switched capacitor 20. The oscillator circuit 300 may further include a reference voltage source 34 configured to provide a reference voltage $V_{ref}$. A first input (+) of the integrator 22 may be electrically coupled to the compensated current source 100 and the switched capacitor 20, and a second input (−) of the integrator 22 may be electrically coupled to the reference voltage source 34.

During operation, the current source 100 may generate the substantially constant first electrical current Iin+ by using a silicided resistor and/or metal resistor as described in connection with FIGS. 1 and 2. The switched capacitor 20 may generate the opposite second electrical current Iin−. The difference of both electrical currents Iin+ and Iin− may be integrated by the integrator 22 and the obtained integration signal 24 may control the oscillator 26. For example, the oscillator 26 may correspond to one of a voltage controlled oscillator (VCO), a current controlled oscillator (ICO) or a digitally controlled oscillator (DCO). Depending on the oscillator type, the integration signal 24 may correspond to one of an output voltage $V_{out}$, an output electrical current $I_{out}$ or an output digital signal Dout. The output frequency signal 28 of the oscillator 26 may control the electrical current Iin− generated by the switched capacitor 20 in the feedback loop. In a non-limiting example, the output frequency $f_{out}$ may have a value of about 80 MHz or about 100 MHz, but may differ in further examples.

Figure 4:
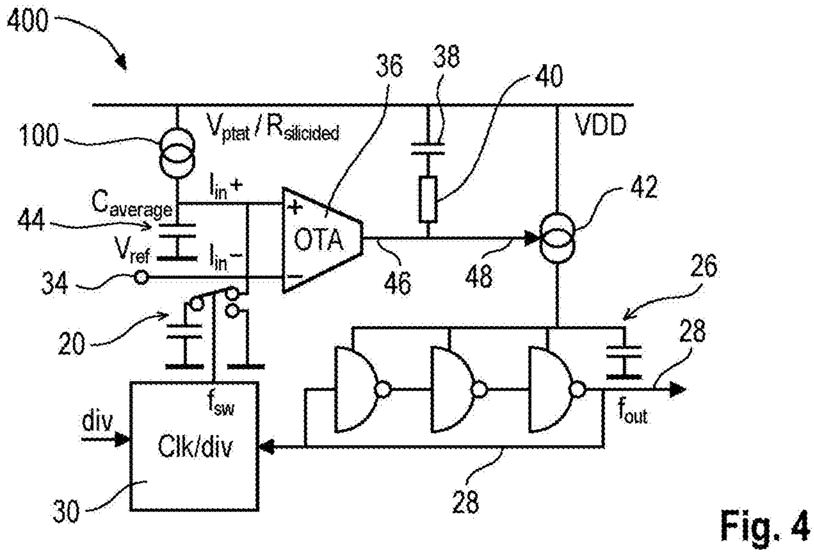
FIG. 4 illustrates a schematic diagram of an oscillator circuit 400 in accordance with the disclosure.

Referring now to FIG. 4, an oscillator circuit 400 may include some or all features of the oscillator circuit 300 of FIG. 3. The oscillator circuit 400 may be seen as a more detailed version of the oscillator circuit 300. An integrator of the oscillator circuit 400 may include an OTA 36, a capacitor 38 and a resistor 40. The integrator may be a Gm-C integrator. An oscillator 26 of the oscillator circuit 400 may include or may correspond to a ring oscillator or relaxation type oscillator. In the illustrated example, the oscillator 26 may be a ring oscillator including an odd number (here: three) of inverters forming an inverter chain. The oscillator circuit 400 may further include a current source 42 electrically coupled to the output of the OTA 36 and to the input of the oscillator 26. An output current provided by the current source 42 may be controlled based on the integration signal of the integrator. The output current of the current source 42 may be configured to control the output frequency $f_{out}$ of the oscillator 26. In other examples, the oscillator circuit 400 may include a voltage source controlled by the integration signal and configured to provide an output voltage for controlling the output frequency $f_{out}$ of the oscillator 26.

The switched capacitor 20 may be substantially independent of mechanical stress. In a first switching state, the switch may be in an upper position and the capacitor 20 may be charged by the electrical current Iin+ provided by the current source 100. In a second switching state, the switch may be in a lower position and the capacitor 20 may be discharged. That is, during operation, the electrical current Iin+ may charge the switched capacitor 20, but switching the capacitor 20 with the switching frequency $f_{sw}$ may also cause the switched capacitor 20 to discharge periodically. Such constant charging and discharging of the switched capacitor 20 may generate the opposite electrical current Iin− provided by the switched capacitor 20. In particular, the generated opposite electrical current Iin− may be proportional to the switching frequency few of the switched capacitor 20. The higher the switching frequency $f_{sw}$, the higher the generated electrical current Iin− may be. Due to the loop of the circuit the frequency-dependent opposite electrical current Iin− may be regulated to the electrical current Iin+ provided by the current source 100. Consequently, in a balanced state, an average voltage of the capacitor 20 may match the constant reference voltage $V_{ref}$. A goal of the oscillator circuit 400 may thus be seen in regulating the average voltage of the capacitor 20 in the loop to match the reference voltage $V_{ref}$.

If the average voltage of the capacitor 20 deviates from the reference voltage $V_{ref}$, a voltage difference may be applied at the inputs of the OTA 36. The OTA 36 may then act as a voltage-current converter and may output an electrical current signal 46 depending on the applied voltage difference. The electrical current signal 46 output by the OTA 36 may load the capacitor 38 and may be integrated by the integrator. In this context, the resistor 40 may be configured to provide dynamic compensation. A voltage building up across the capacitor 38 may be proportional to an integral of the charging current 46 over time. The integrated current may be converted into a voltage signal 48 controlling the current source 42. An output signal of the current source 42 may control the oscillator 26 which in this case may be a current controlled oscillator (ICO). Furthermore, the output frequency signal 28 provided by the oscillator 26 may control the switching frequency $f_{sw}$ of the switched capacitor 20. The control loop allows the oscillator 26 to settle into a balanced state such that a constant output frequency $f_{out}$ may be provided.

The frequency divider 30 may be seen as optional in some examples. The frequency divider 30 may be configured to divide down the frequency $f_{out}$ of the output frequency signal 28 by a factor div. In a non-limiting example, the factor div may have a value of 10, 16 or 32. By switching the capacitor 20 with a reduced switching frequency $f_{sw}$, dynamic effects (such as parasitic capacities) may be reduced or may become negligible such that an operating accuracy of the oscillator circuit 400 may be enhanced.

Figure 5:
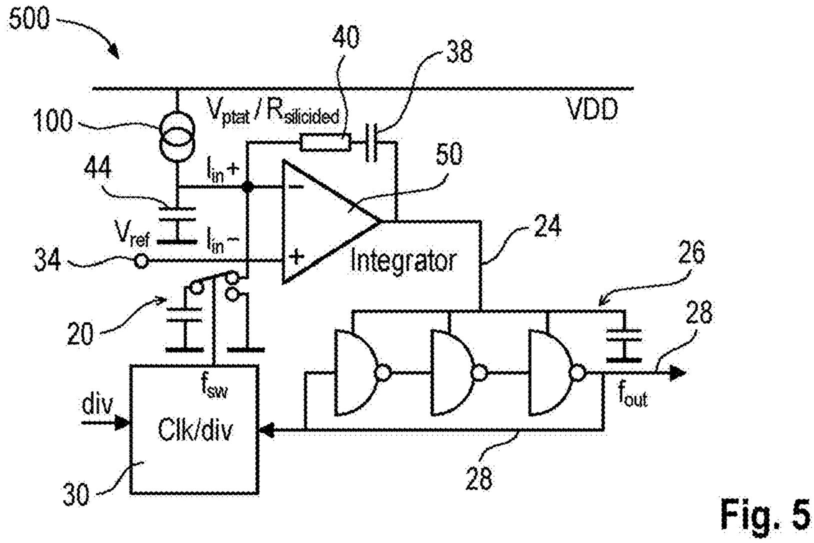
FIG. 5 illustrates a schematic diagram of an oscillator circuit 500 in accordance with the disclosure.

Referring now to FIG. 5, an oscillator circuit 500 may include some or all features of previously described oscillator circuits. The oscillator circuit 500 may include an operational amplifier integrator having an operational amplifier 50, a capacitor 38 and a resistor 40. Similar to the example of FIG. 4, if the average voltage of the switched capacitor 20 deviates from the reference voltage $V_{ref}$, a voltage difference may be applied at the inputs of the operational amplifier 50. The integrator may integrate the applied voltage difference and based thereon the operational amplifier 50 may output an integration signal 24 in form of a voltage signal. The voltage signal may control the oscillator 26 which in this case may be a voltage controlled oscillator (VCO).

Figure 6:
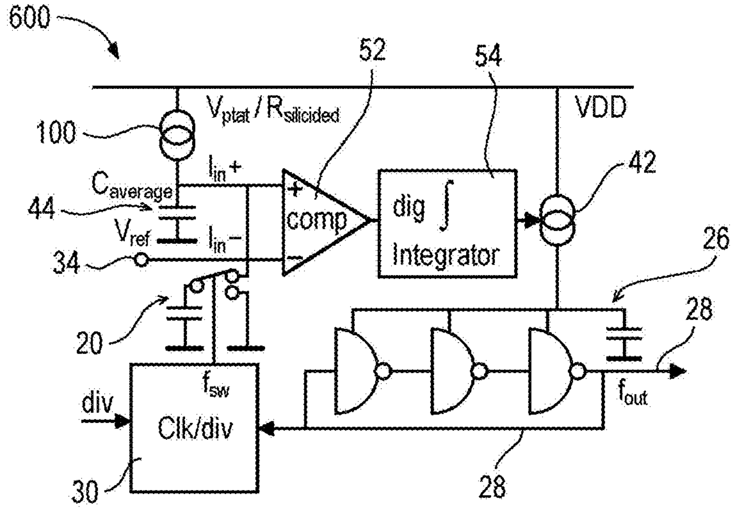
FIG. 6 illustrates a schematic diagram of an oscillator circuit 600 in accordance with the disclosure.

Referring now to FIG. 6, an oscillator circuit 600 may include some or all features of previously described oscillator circuits. The oscillator circuit 600 may include a comparator 52 and a digital integrator 54 arranged downstream. Similar to previous examples, if the average voltage of the switched capacitor 20 deviates from the reference voltage $V_{ref}$, a voltage difference may be applied at the inputs of the comparator 52. The digital integrator 54 may perform an integration based on an output signal of the comparator 52. Based on the performed integration, the digital integrator 54 may output a signal for controlling the current source 42. An output signal of the current source 42 may control the oscillator 26 which in this case may be a current controlled oscillator (ICO).

Figure 7:
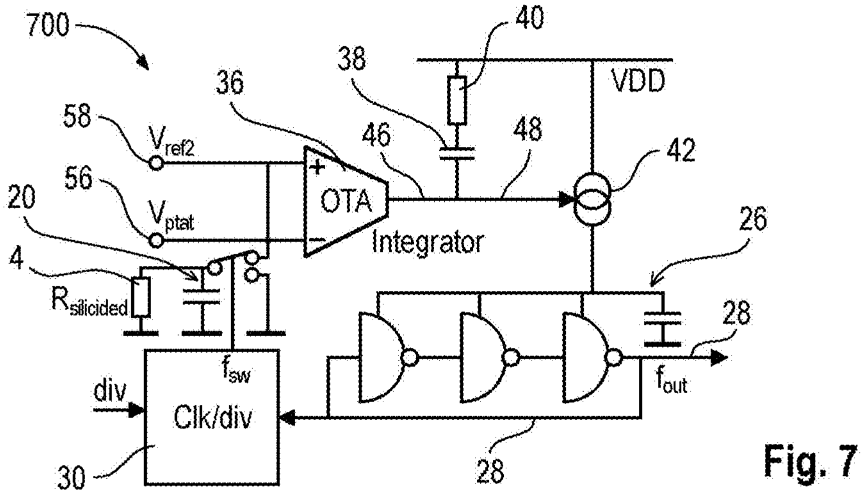
FIG. 7 illustrates a schematic diagram of an oscillator circuit 700 in accordance with the disclosure.

Referring now to FIG. 7, another oscillator circuit 700 in accordance with the disclosure is illustrated which may include some or all features of previously described oscillator circuits. The oscillator circuit 700 may include a PTAT voltage source 56 configured to provide a voltage $V_{ptat}$ proportional to absolute temperature. In addition, a reference voltage source 58 may be configured to provide a reference voltage $V_{ref2}$. An RC element of the oscillator circuit 700 may include a switched capacitor 20 and a silicided and/or metal resistor 4. The oscillator circuit 700 may further include an integrator which in the illustrated example may include an OTA 36, a capacitor 38 and a resistor 40. A first input of the OTA 36 may be configured to receive a first input signal based on the reference voltage $V_{ref2}$ and an output voltage of the RC element. A second input of the OTA 36 may be configured to receive a second input signal based on the voltage $V_{ptat}$. The integrator may be configured to perform an integration based on a difference or sum of the first input signal and the second input signal and to provide an integration signal based on the integration. The oscillator circuit 700 may further include an oscillator 26 configured to provide an output frequency signal 28, wherein the output frequency signal 28 may be controlled based on the integration signal provided by the integrator. The switched capacitor 20 may be controlled in a feedback loop based on the output frequency signal 28 of the oscillator 26.

In the illustrated example, a silicided and/or metal resistor 4 may be used in the RC element as opposed to previous examples where a silicided and/or metal resistor was used in a current source. Note that the integrator of FIG. 7 may be similar to the integrator described in connection with FIG. 4. Similar to previous examples, the control loop of the circuit may allow the oscillator 26 to settle into a balanced state such that a constant output frequency $f_{out}$ may be provided.

The previously described oscillator circuits may include further components which are not illustrated for the sake of simplicity. For example, an oscillator circuit in accordance with the disclosure may include at least one of a temperature sensor or a mechanical stress sensor. The temperature sensor may be configured to provide a first sensor signal representative of a temperature of the oscillator circuit. The mechanical stress sensor may be configured to provide a second sensor signal representative of a mechanical stress in the silicided resistor and/or metal resistor 4. In addition, an oscillator circuit may include a (digital or analog) processing unit (e.g., a processing circuit) configured to adjust at least one of the reference voltage $V_{ref}$, the voltage $V_{ptat}$, the division factor div of the frequency divider 30, or the switched capacitor 20 based on at least one of the first sensor signal or the second sensor signal. The described adjustment performed by the processing unit and based on the provided sensor signals may allow for a digitally assisted compensation of remaining and higher order mechanical stress and temperature effects. The processing unit may include one or more processors, one or more analog processing components, and/or one or more digital processing components for processing and/or adjusting electrical signals.

Figure 8:
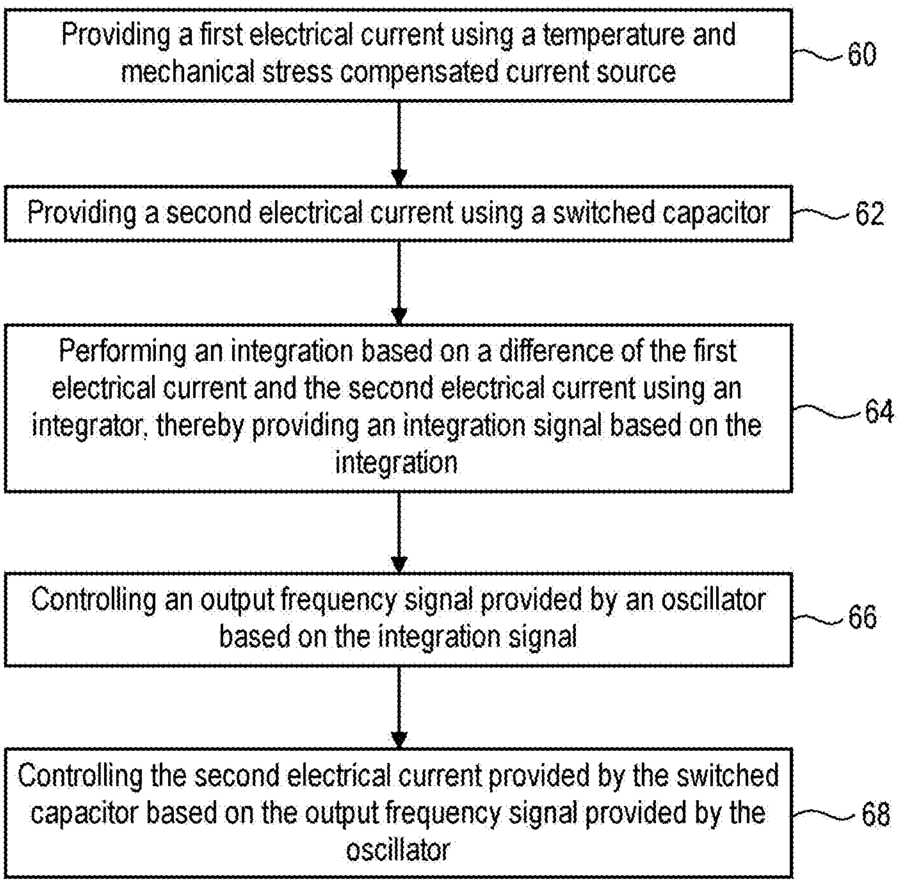
FIG. 8 illustrates a flowchart of a method for providing a periodic frequency signal in accordance with the disclosure.

Referring now to FIG. 8, a flowchart of a method in accordance with the disclosure for providing a periodic frequency signal is illustrated. The method is described in a general manner in order to qualitatively specify aspects of the disclosure. For example, the method may be performed by one of the oscillator circuits previously described. It is to be understood that the method may include further aspects. For example, the method may be extended by any of the aspects discussed in connection with other examples described herein.

At 60, a first electrical current may be provided using a temperature and mechanical stress compensated current source. At 62, a second electrical current may be provided using a switched capacitor. At 64, an integration may be performed based on a difference of the first electrical current and the second electrical current using an integrator. An integration signal may be provided based on the integration. At 66, an output frequency signal provided by an oscillator may be controlled based on the integration signal. At 68, the second electrical current provided by the switched capacitor may be controlled based on the output frequency signal provided by the oscillator.

The method of FIG. 8 may include one or more further steps that may be seen as optional. For example, referring to the frequency divider 30 of previous examples, a switching frequency signal may be provided by the frequency divider based on the output frequency signal provided by the oscillator. In yet a further step, the second electrical current provided by the switched capacitor may be controlled based on the switching frequency signal.

Oscillator circuits in accordance with the disclosure may provide the following example technical effects and, based thereon, outperform conventional devices in various aspects.

The current sources of the oscillator circuits described herein may be temperature and mechanical stress compensated due to an analog pre-compensation of mechanical stress and temperature effects as described in connection with the examples of FIGS. 1 and 2. In addition, a digitally assisted compensation of remaining and higher order mechanical stress and temperature effects may be provided. As a result, the oscillator circuits described herein may provide high and stable output frequencies. The oscillator circuits may provide high stability against temperature, lifetime and aging effects caused by mechanical and partially electrical stress.

Conventional oscillator circuits, such as relaxation type oscillators, may suffer from delay effects (and accompanying aging effects) that may be caused by usage of a comparator. Such delay effects may drift over lifetime, for example caused by mechanical stress. In oscillator circuits using comparators, the delay effects may typically influence the target frequency by about 0.5-3%. Oscillator circuits in accordance with the disclosure may be free from the mentioned delay effects. The delay effects may be reduced to practically 0%. Any remaining delay effects in the overall circuit are also only taken into account as a second approximation and are in any case smaller than about 0.1%.

The oscillator circuits described herein may provide high output frequencies at low power consumption. In addition, the discussed concepts may enable low-power consumption with an additional duty-cycled operation to further reduce power consumption. In non-limiting examples, the oscillator circuits described herein may be used for high-speed interfaces for sensors, battery powered IoT sensor nodes with low power consumption, high-speed inductive angle sensors, or the like.

Aspects

In the following, oscillator circuits, current sources and methods for providing periodic frequency signals in accordance with the disclosure are described using aspects.

Aspect 1 is an oscillator circuit, comprising: a temperature and mechanical stress compensated current source configured to provide a first electrical current; a switched capacitor configured to provide a second electrical current; an integrator configured to perform an integration based on a difference of the first electrical current and the second electrical current and to provide an integration signal based on the integration; and an oscillator configured to provide an output frequency signal, wherein the output frequency signal is controlled based on the integration signal provided by the integrator, wherein the second electrical current provided by the switched capacitor is controlled in a feedback loop based on the output frequency signal of the oscillator.

Aspect 2 is an oscillator circuit according to Aspect 1, wherein the compensated current source comprises a proportional to absolute temperature (PTAT) voltage source configured to provide a voltage proportional to absolute temperature (VPTAT), wherein the PTAT voltage source comprises at least one of a silicided resistor or a metal resistor.

Aspect 3 is an oscillator circuit according to Aspect 2, wherein the compensated current source comprises a PTAT current source configured to provide a current proportional to absolute temperature (IPTAT), wherein the PTAT current source comprises a bandgap reference circuit.

Aspect 4 is an oscillator circuit according to Aspect 3, wherein: a value of the IPTAT depends on a first temperature coefficient based on the VPTAT, a value of the silicided resistor and/or metal resistor depends on a second temperature coefficient, and the first temperature coefficient substantially matches the second temperature coefficient.

Aspect 5 is an oscillator circuit according to one of Aspects 2 to 4, wherein the silicided resistor and/or metal resistor forms an L-shaped resistor.

Aspect 6 is an oscillator circuit according to one of the preceding Aspects, further comprising: a frequency divider configured to provide a switching frequency signal based on the output frequency signal provided by the oscillator, wherein the switching frequency signal is configured to control the second electrical current provided by the switched capacitor.

Aspect 7 is an oscillator circuit according to one of the preceding Aspects, further comprising: a reference voltage source configured to provide a reference voltage, wherein a first input of the integrator is electrically coupled to the compensated current source and the switched capacitor and a second input of the integrator is electrically coupled to the reference voltage source.

Aspect 8 is an oscillator circuit according to one of the preceding Aspects, wherein the oscillator comprises a ring oscillator or relaxation type oscillator.

Aspect 9 is an oscillator circuit according to one of Aspects 2 to 8, wherein the compensated current source further comprises a constant voltage source configured to provide a substantially constant voltage, wherein the constant voltage source comprises a non-silicided polysilicon resistor.

Aspect 10 is an oscillator circuit according to Aspect 9, wherein: the electrical current provided by the compensated current source is generated based on a first electrical current and a second electrical current (e.g., a third electrical current and a fourth) electrical current, the first electrical current depends on the VPTAT and the value of the silicided resistor and/or metal resistor, and the second electrical current depends on the constant voltage and the value of the non-silicided polysilicon resistor.

Aspect 11 is an oscillator circuit according to Aspect 10, wherein: the electrical current provided by the compensated current source depends on a subtraction or summation of the second electrical current weighted by a weighting factor and the first electrical current, and the weighting factor is adjusted to reduce a mechanical stress dependence of the electrical current provided by the compensated current source.

Aspect 12 is an oscillator circuit according to one of the preceding Aspects, further comprising: at least one of a temperature sensor or a mechanical stress sensor, wherein the temperature sensor is configured to provide a first sensor signal representative of a temperature of the oscillator circuit, wherein the mechanical stress sensor is configured to provide a second sensor signal representative of a mechanical stress in the silicided resistor and/or metal resistor, and a processing unit configured to adjust at least one of the reference voltage, the VPTAT, a division factor of the frequency divider or the switched capacitor based on at least one of the first sensor signal or the second sensor signal.

Aspect 13 is an oscillator circuit according to one of the preceding Aspects, further comprising: a further voltage source or a further current source, wherein an output voltage or an output current provided by the further voltage source or the further current source is controlled based on the integration signal of the integrator, wherein the output voltage or output current is configured to control the output frequency signal (e.g., an output frequency) of the oscillator.

Aspect 14 is an oscillator circuit according to Aspect 13, wherein the integrator comprises an operational transconductance amplifier electrically coupled to the further voltage source or the further current source.

Aspect 15 is an oscillator circuit according to Aspect 13, wherein the integrator comprises a digital integrator electrically coupled to the further voltage source or the further current source.

Aspect 16 is an oscillator circuit, comprising: a PTAT voltage source configured to provide a voltage proportional to absolute temperature (VPTAT); a reference voltage source configured to provide a reference voltage; an RC element comprising a switched capacitor and a silicided and/or metal resistor; an integrator, wherein a first input of the integrator is configured to receive a first input signal based on the reference voltage and an output voltage of the RC element, and a second input of the integrator is configured to receive a second input signal based on the VPTAT, wherein the integrator is configured to perform an integration based on a difference or sum of the first input signal and the second input signal and to provide an integration signal based on the integration; and an oscillator configured to provide an output frequency signal, wherein the output frequency signal is controlled based on the integration signal provided by the integrator, wherein the switched capacitor is controlled in a feedback loop based on the output frequency signal of the oscillator.

Aspect 17 is a current source configured to provide a temperature and mechanical stress compensated electrical current, the current source comprising: a PTAT voltage source configured to provide a voltage proportional to absolute temperature (VPTAT), wherein the PTAT voltage source comprises a silicided polysilicon resistor and/or metal resistor.

Aspect 18 is a current source according to Aspect 17, wherein: a value of the VPTAT depends on a first temperature coefficient, a value of the silicided polysilicon resistor and/or metal resistor depends on a second temperature coefficient, and the first temperature coefficient substantially matches the second temperature coefficient.

Aspect 19 is a method for providing a periodic frequency signal, the method comprising: providing a first electrical current using a temperature and mechanical stress compensated current source; providing a second electrical current using a switched capacitor; performing an integration based on a difference of the first electrical current and the second electrical current using an integrator, thereby providing an integration signal based on the integration; controlling an output frequency signal provided by an oscillator based on the integration signal; and controlling the second electrical current provided by the switched capacitor based on the output frequency signal provided by the oscillator.

Aspect 20 is a method according to Aspect 19, further comprising: providing a switching frequency signal based on the output frequency signal using a frequency divider, and controlling the second electrical current provided by the switched capacitor based on the switching frequency signal.

While the present disclosure has been described with reference to illustrative aspects, this description is not intended to be construed in a limiting sense. Various modifications and combinations of the illustrative aspects, as well as other aspects of the disclosure, will be apparent to persons skilled in the art upon reference of the description. It is therefore intended that the appended claims encompass any such modifications or aspects.

The invention claimed is:

1. An oscillator circuit, comprising:

a temperature and mechanical stress compensated current source configured to provide a first electrical current;

a switched capacitor configured to provide a second electrical current;

an integrator configured to perform an integration based on a difference of the first electrical current and the second electrical current and to provide an integration signal based on the integration;

an oscillator configured to provide an output frequency signal, wherein the output frequency signal is controlled based on the integration signal provided by the integrator, and wherein the second electrical current provided by the switched capacitor is controlled in a feedback loop based on the output frequency signal of the oscillator;

at least one of a temperature sensor or a mechanical stress sensor, wherein the temperature sensor is configured to provide a first sensor signal representative of a temperature of the oscillator circuit, and wherein the mechanical stress sensor is configured to provide a second sensor signal representative of a mechanical stress of the oscillator circuit; and a processing circuit configured to adjust at least one of a reference voltage, a voltage proportional to absolute temperature (VPTAT), a division factor of a frequency divider, or the switched capacitor based on at least one of the first sensor signal or the second sensor signal.

2. The oscillator circuit of claim 1, wherein the temperature and mechanical stress compensated current source comprises a proportional to absolute temperature (PTAT) voltage source configured to provide a voltage proportional to absolute temperature (VPTAT), wherein the PTAT voltage source comprises at least one of a silicided resistor or a metal resistor.

3. The oscillator circuit of claim 2, wherein the temperature and mechanical stress compensated current source comprises a PTAT current source configured to provide a current proportional to absolute temperature (IPTAT), and wherein the PTAT current source comprises a bandgap reference circuit.

4. The oscillator circuit of claim 3, wherein:

a value of the IPTAT depends on a first temperature coefficient based on the VPTAT, a value of the silicided resistor or the metal resistor depends on a second temperature coefficient, and the first temperature coefficient substantially matches the second temperature coefficient.

5. The oscillator circuit of claim 2, wherein the silicided resistor or the metal resistor forms an L-shaped resistor.

6. The oscillator circuit of claim 1, further comprising: the frequency divider configured to provide a switching frequency signal based on the output frequency signal provided by the oscillator, wherein the switching frequency signal is configured to control the second electrical current provided by the switched capacitor.

7. The oscillator circuit of claim 1, further comprising: a reference voltage source configured to provide a reference voltage, wherein a first input of the integrator is electrically coupled to the temperature and mechanical stress compensated current source and the switched capacitor, and wherein a second input of the integrator is electrically coupled to the reference voltage source.

8. The oscillator circuit of claim 1, wherein the oscillator comprises a ring oscillator or a relaxation type oscillator.

9. The oscillator circuit of claim 2, wherein the temperature and mechanical stress compensated current source further comprises a constant voltage source configured to provide a substantially constant voltage, wherein the constant voltage source comprises a non-silicided polysilicon resistor.

10. The oscillator circuit of claim 9, wherein:

the first electrical current provided by the temperature and mechanical stress compensated current source is generated based on a third electrical current and a fourth electrical current, the third electrical current depends on the VPTAT and a value of the silicided resistor or the metal resistor, and the fourth electrical current depends on the constant voltage and the value of the non-silicided polysilicon resistor.

11. The oscillator circuit of claim 10, wherein:

the first electrical current provided by the temperature and mechanical stress compensated current source depends on a subtraction or summation of the fourth electrical current weighted by a weighting factor and the third electrical current, and the weighting factor is adjusted to reduce a mechanical stress dependence of the first electrical current provided by the temperature and mechanical stress compensated current source.

12. The oscillator circuit of claim 1, further comprising: at least one of a silicided resistor or a metal resistor, wherein the at least one of the silicided resistor or the metal resistor include a first resistor and a second resistor serially connected and arranged substantially perpendicular to each other, accounting for mechanical stress in both directions.

13. The oscillator circuit of claim 1, further comprising: a further voltage source or a fourth current source, wherein an output voltage or an output current provided by the further voltage source or the further current source is controlled based on the integration signal of the integrator, and wherein the output voltage or the output current is configured to control the output frequency signal of the oscillator.

14. The oscillator circuit of claim 13, wherein the integrator comprises an operational transconductance amplifier electrically coupled to the further voltage source or the further current source.

15. The oscillator circuit of claim 13, wherein the integrator comprises a digital integrator electrically coupled to the further voltage source or the further current source.

16. An oscillator circuit, comprising:

a proportional to absolute temperature (PTAT) voltage source configured to provide a voltage proportional to absolute temperature (VPTAT);

a reference voltage source configured to provide a reference voltage;

a resistor-capacitor (RC) element comprising a switched capacitor and at least one of a silicided resistor or a metal resistor;

an integrator, wherein a first input of the integrator is configured to receive a first input signal based on the reference voltage and an output voltage of the RC element, and a second input of the integrator is configured to receive a second input signal based on the VPTAT, and wherein the integrator is configured to perform an integration based on a difference or a sum of the first input signal and the second input signal, and to provide an integration signal based on the integration;

an oscillator configured to provide an output frequency signal, wherein the output frequency signal is controlled based on the integration signal provided by the integrator, and wherein the switched capacitor is controlled in a feedback loop based on the output frequency signal of the oscillator;

at least one of a temperature sensor or a mechanical stress sensor, wherein the temperature sensor is configured to provide a first sensor signal representative of a temperature of the oscillator circuit, and wherein the mechanical stress sensor is configured to provide a second sensor signal representative of a mechanical stress of the oscillator circuit; and a processing circuit configured to adjust at least one of the reference voltage, the VPTAT, a division factor of a frequency divider, or the switched capacitor based on at least one of the first sensor signal or the second sensor signal.

17. A device configured to provide a temperature and mechanical stress compensated electrical current, the device comprising:

a proportional to absolute temperature (PTAT) voltage source configured to provide a voltage proportional to absolute temperature (VPTAT), wherein the PTAT voltage source comprises at least one of a silicided polysilicon resistor or a metal resistor;

at least one of a temperature sensor or a mechanical stress sensor, wherein the temperature sensor is configured to provide a first sensor signal representative of a temperature of an oscillator circuit, and wherein the mechanical stress sensor is configured to provide a second sensor signal representative of a mechanical stress of the oscillator circuit; and a processing circuit configured to adjust at least one of a reference voltage, the VPTAT, a division factor of a frequency divider, or a switched capacitor based on at least one of the first sensor signal or the second sensor signal.

18. The device of claim 17, wherein:

a value of the VPTAT depends on a first temperature coefficient, a value of the silicided polysilicon resistor or the metal resistor depends on a second temperature coefficient, and the first temperature coefficient substantially matches the second temperature coefficient.

19. A method for providing a periodic frequency signal, the method comprising:

providing a first electrical current using a temperature and mechanical stress compensated current source;

providing a second electrical current using a switched capacitor;

performing an integration based on a difference of the first electrical current and the second electrical current using an integrator, thereby providing an integration signal based on the integration;

controlling an output frequency signal provided by an oscillator based on the integration signal;

controlling the second electrical current provided by the switched capacitor based on the output frequency signal provided by the oscillator; and adjusting at least one of a reference voltage, a voltage proportional to absolute temperature (VPTAT), a division factor of a frequency divider, or the switched capacitor based on at least one of a first sensor signal or a second sensor signal, wherein the first sensor signal is representative of a temperature of the oscillator, and is provided by a temperature sensor, and wherein the second sensor signal is representative of a mechanical stress of the oscillator, and is provided by a mechanical stress sensor.

20. The method of claim 19, further comprising:

providing a switching frequency signal based on the output frequency signal using the frequency divider, and controlling the second electrical current provided by the switched capacitor based on the switching frequency signal.

* * * * *